(12) United States Patent
Luo et al.

(10) Patent No.: US 10,353,715 B2
(45) Date of Patent: **\*Jul. 16, 2019**

(54) LOW POWER NON-VOLATILE SRAM MEMORY SYSTEMS

(71) Applicant: Aspiring Sky Co. Limited, Hong Kong (CN)

(72) Inventors: Zhijiong Luo, Hopewell Township, PA (US); Xiaoming Jin, Shanghai (CN); Shu Wang, Shanghai (CN); Zuqu Li, Shanghai (CN)

(73) Assignee: Aspiring Sky Co. Limited, Hong Kong (CN)

( \* ) Notice: Subject to any disclaimer, the term of this patent is extended or adjusted under 35 U.S.C. 154(b) by 0 days.

This patent is subject to a terminal disclaimer.

(21) Appl. No.: 15/855,094

(22) Filed: Dec. 27, 2017

(65) Prior Publication Data

US 2018/0121212 A1 May 3, 2018

Related U.S. Application Data

(63) Continuation-in-part of application No. 15/787,665, filed on Oct. 18, 2017, which is a continuation-in-part of application No. 15/704,006, filed on Sep. 14, 2017, and a continuation-in-part of application No. 15/704,011, filed on Sep. 14, 2017.

(60) Provisional application No. 62/439,707, filed on Dec. 28, 2016, provisional application No. 62/410,828, filed on Oct. 20, 2016.

(51) Int. Cl.
*G06F 9/44* (2018.01)
*G06F 9/4401* (2018.01)
*G06F 1/30* (2006.01)
*G06F 12/02* (2006.01)

(52) U.S. Cl.
CPC ............ *G06F 9/4418* (2013.01); *G06F 1/305* (2013.01); *G06F 9/4403* (2013.01); *G06F 12/0238* (2013.01); *Y02D 10/13* (2018.01)

(58) Field of Classification Search
CPC ...... G06F 9/4418; G06F 9/4403; G06F 1/305; G06F 12/0238
See application file for complete search history.

(56) References Cited

U.S. PATENT DOCUMENTS 6,525,562 B1 2/2003 Schultz et al.
8,861,271 B1 \* 10/2014 Zain ........................ G11C 8/20
365/154

(Continued)

*Primary Examiner* — Ajay Ojha
(74) *Attorney, Agent, or Firm* — Turk IP Law, LLC

(57) ABSTRACT

Memory structures are provided, where a fast SRAM in an mNVSRAM block may serve as the buffer for a large block NVM memory to increase the data exchange rate between computing units or processor cores and the large NVM memory. The mNVSRAM blocks may also provide a fast boot function, where a boot code may be stored in the NVM parts of the mNVSRAM block, and due to the high bandwidth communication between fast SRAM part and the associated NVM memories, the boot code may be transferred into the fast SRAM in one or a few clock cycles enabling fast boot up function. Similarly, code stored in the NVM parts of an mNVSRAM block may be transferred into fast SRAM rapidly at wake-up time enabling fast wake up and voiding a need to wake up any other memory part, which may also result in energy savings for the computing system.

16 Claims, 15 Drawing Sheets

(56) References Cited

U.S. PATENT DOCUMENTS

| | | | |
|---|---|---|---|
| 9,318,196 B1* | 4/2016 | Kasai | G11C 14/0063 |
| 9,349,440 B1 | 5/2016 | Ma | |
| 9,473,204 B2 | 10/2016 | Lin et al. | |
| 9,640,256 B1* | 5/2017 | Roy | G11C 14/0081 |
| 2003/0001615 A1 | 1/2003 | Sueyoshi et al. | |
| 2007/0297396 A1* | 12/2007 | Eldar | H04L 63/08 |
| | | | 370/356 |
| 2013/0207170 A1 | 8/2013 | Kurokawa | |
| 2014/0085978 A1* | 3/2014 | Lee | G11C 14/0063 |
| | | | 365/185.08 |
| 2014/0368235 A1 | 12/2014 | Aoki et al. | |
| 2015/0348621 A1 | 12/2015 | Sako | |
| 2016/0078938 A1* | 3/2016 | Hsu | G11C 14/0063 |
| | | | 365/185.08 |
| 2016/0173103 A1 | 6/2016 | Gao et al. | |

* cited by examiner

LOW POWER NON-VOLATILE SRAM MEMORY SYSTEMS

CROSS REFERENCE TO RELATED APPLICATIONS

This application claims the benefit of U.S. Provisional Patent Application Ser. No. 62/439,707 filed on Dec. 28, 2016. This application is also a Continuation-in-part (CIP) of U.S. patent application Ser. No. 15/787,665 filed on Oct. 18, 2017. The disclosures of the above-referenced applications are hereby incorporated by reference for all purposes.

BACKGROUND

Unless otherwise indicated herein, the materials described in this section are not prior art to the claims in this application and are not admitted to be prior art by inclusion in this section.

Despite developments in integrated circuitry and processing technologies, computers are still considered slow at boot-up or wake-up times. At bot-up or wake-up time, a computer needs to retrieve data from memory and execute essential programs. However, non-volatile memory (NVM) systems may be slow to write or read data. Thus, a computer's power-up or wake-up speed depends on its data retrieval capability/memory system. If a computer cannot wake up rapidly enough, users may not prefer to allow it to be placed in sleep mode wasting energy.

SUMMARY

Briefly stated, technologies are generally described herein for multi-bit (multi-page) non-volatile static random access memory (NVSRAM) systems, which may enable computing devices to enhance their boot-up and/or wake-up speeds.

In some memory structures according to embodiments, a fast SRAM in an mNVSRAM block may serve as the buffer for a large block NVM memory to increase the data exchange rate between computing units or processor cores and the large NVM memory. The mNVSRAM blocks may also provide a fast boot function, where a boot code may be stored in the NVM parts of the mNVSRAM block, and due to the high bandwidth communication between fast SRAM part and the associated NVM memories, the boot code may be transferred into the fast SRAM in one or a few clock cycles enabling fast boot up function. Similarly, code stored in the NVM pans of an mNVSRAM block may be transferred into fast SRAM rapidly at wake-up time enabling fast wake up and voiding a need to wake up any other memory part, which may also result in energy savings for the computing system.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

Figure 1A:
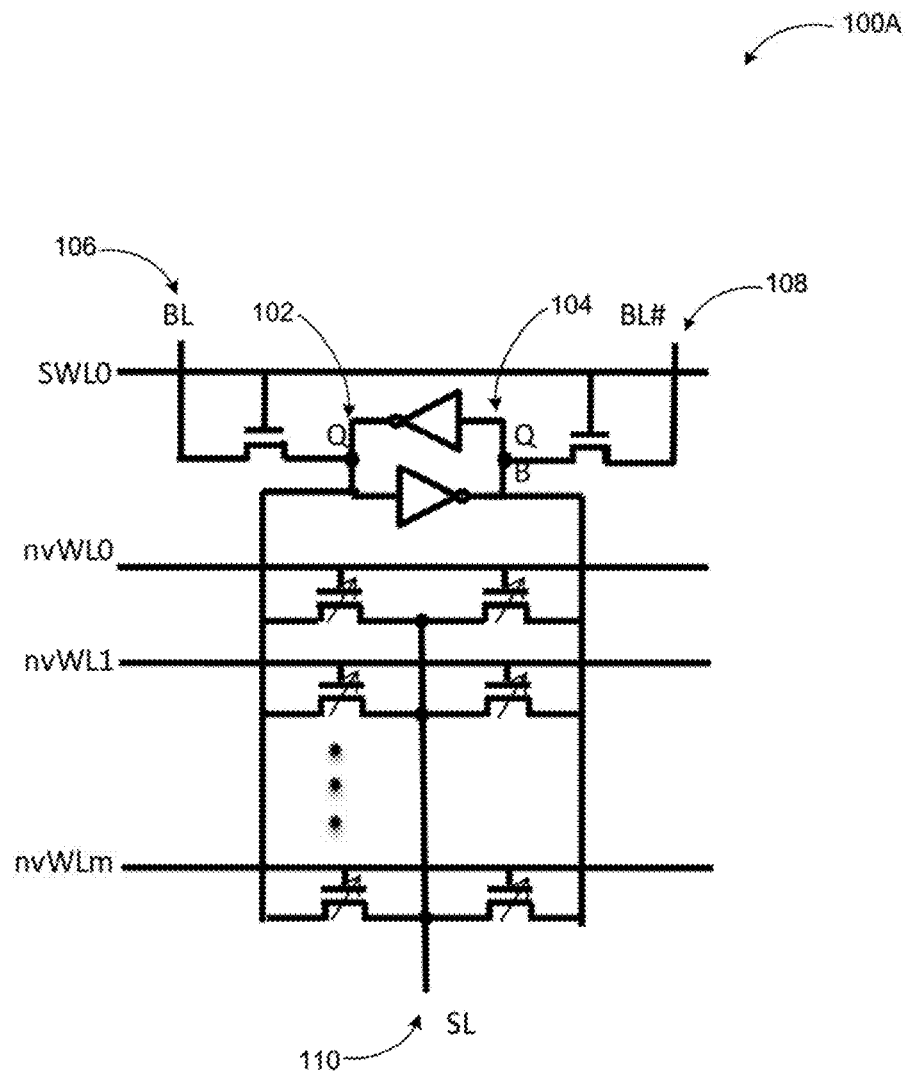
FIG. 1A is a schematic circuit diagram illustrating an example NVSRAM cell formed by a combination of an SRAM cell with multiple NVM cells.

all arranged according to at least some embodiments presented herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description and drawings are not meant to be limiting. Other embodiments may be utilized, and other changes may be made, without departing from the spirit or scope of the subject matter presented herein. The aspects of the present disclosure, as generally described herein, and illustrated in the figures, can be arranged, substituted, combined, separated, and designed in a wide variety of different configurations, all of which are explicitly contemplated herein.

This disclosure is generally drawn, inter alia, to technologies for multi-bit (multi-page) non-volatile static random access memory (NVSRAM) systems, which may enable computing devices to enhance their boot-up and/or wake-up speeds. In some examples, memory structures are provided, where a fast SRAM in an mNVSRAM block may serve as the buffer for a large block NVM memory to increase the data exchange rate between computing units or processor cores and the large NVM memory. The mNVSRAM blocks may also provide a fast boot function, where a boot code may be stored in the NVM parts of the mNVSRAM block, and due to the high bandwidth communication between fast SRAM part and the associated NVM memories, the boot code may be transferred into the fast SRAM in one or a few clock cycles enabling fast boot up function. When a computing system wakes up from a deep sleep mode, the code stored in the NVM parts of an mNVSRAM block may be transferred into the fast SRAM rapidly enabling fast wake up and voiding a need to wake up any other memory part, which may also result in energy savings for the computing system. The mNVSRAM block may be also used as a local memory to store the frequently used code. Then, the total system power may be reduced because the local memory does not need to charge a large array loading to fetch the data. In some cases, the SRAM part of the mNVSRAM block may be shared as one part of the entire computing system SRAM. The SRAM part of an mNVSRAM block may also be connected directly to a CPU and/or a large block NVM memory to be used directly by CPU.

As used herein, NVM memory may include, but is not limited to, a floating gate memory, a SONOS memory, a RRAM (resistive RAM), phase change memories, or magnetic base memories, such as MRAM, and STTRAM, or a Ferroelectric based RAM, or Ferroelectric capacitor based memory.

FIG. 1A is a schematic circuit diagram illustrating an example NVSRAM cell formed by a combination of an SRAM cell with multiple NVM cells, arranged according to at least some embodiments presented herein.

Diagram 100A shows a cell structure for an NVSRAM cell with an SRAM cell (fast SRAM) characterized by the word line SWL0 and two bitlines BL 106, BL#108 coupled to multiple NVM cells 110 forming the rows. The NVM cells (e.g., floating gate) may be connected to the latch nodes Q/QB 102, 104 of the SRAM cell.

Figure 1B:
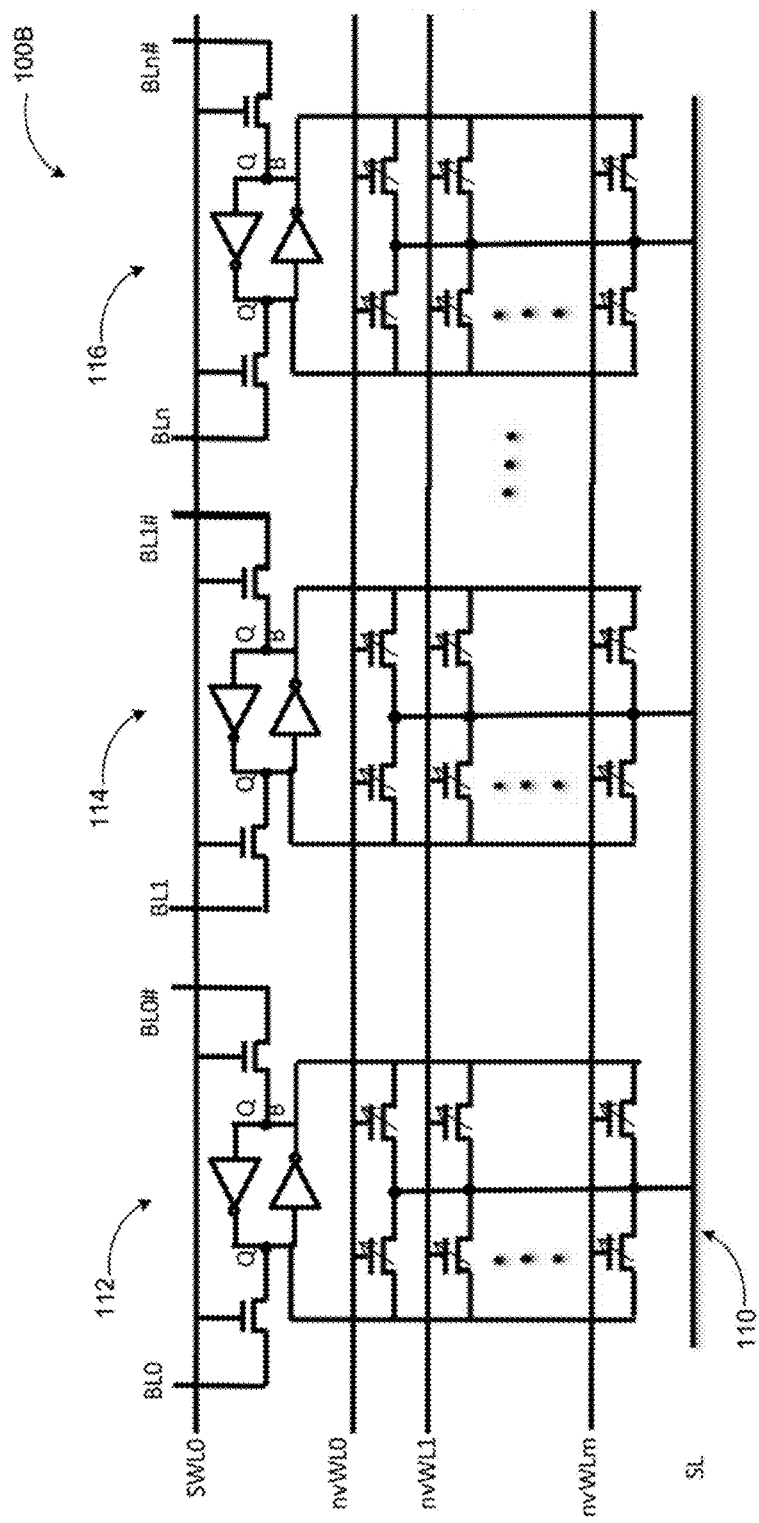
FIG. 1B is a schematics diagram of an array structure formed by the example NVSRAM cells of FIG. 1A.

FIG. 1B is a schematics diagram of an array structure formed by the example NVSRAM cells of FIG. 1A, arranged according to at least some embodiments presented herein.

Diagram 100B shows three example NVSRAM cells 112, 114, 116 combined to form a memory array. Any number of cells may be combined to form multi-cell arrays. The fast SRAM cells share the same word line SWL0, while NVM cells of a same row share respective word lines such as nvWL0, nvWL1, etc. All NVSRAM cells may be coupled to SL 110 as shown in the diagram.

Figure 2A:
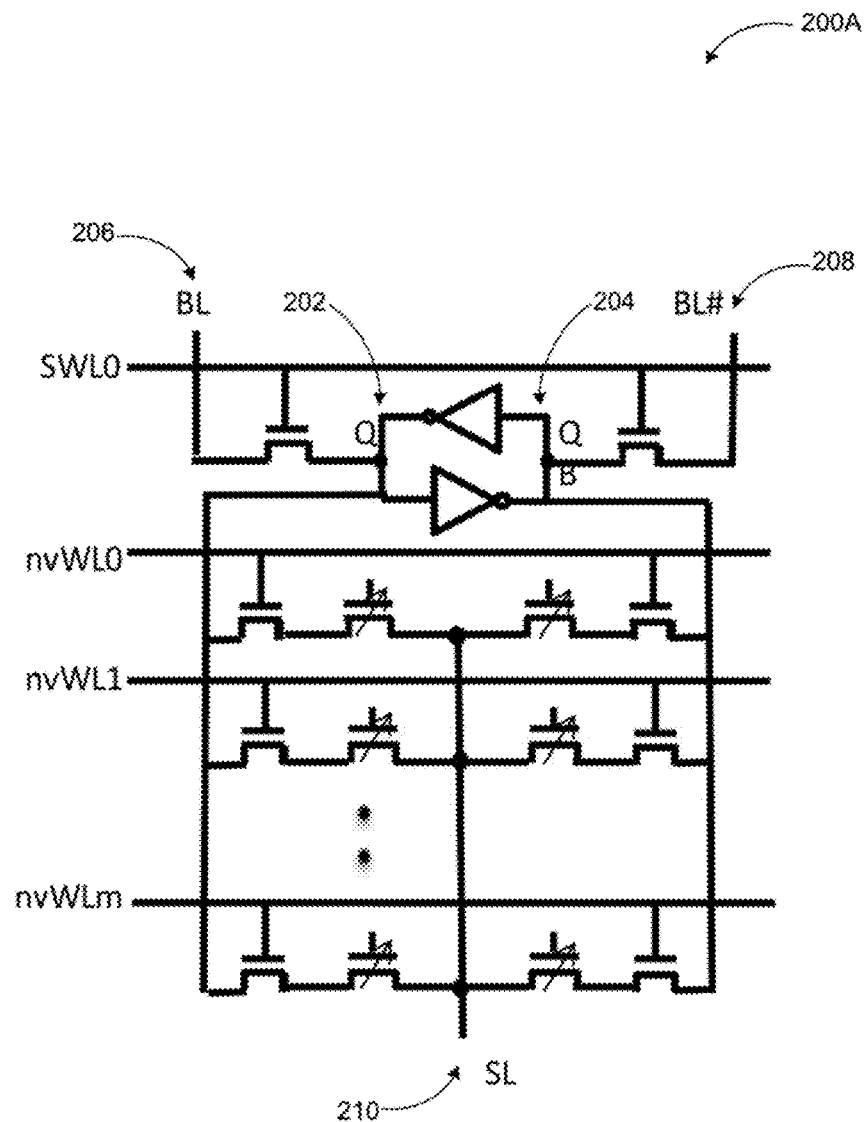
FIG. 2A is a schematic circuit diagram illustrating another example NVSRAM cell formed by a combination of an SRAM cell with multiple NVM cells.

FIG. 2A is a schematic circuit diagram illustrating another example NVSRAM cell formed by a combination of an SRAM cell with multiple NVM cells, arranged according to at least some embodiments presented herein.

Diagram 200A shows a cell structure for an NVSRAM cell with an SRAM cell (fast SRAM) characterized by the word line SWL0 and two bitlines BL 206, BL#208 coupled to multiple NVM cells 210 forming the rows. The NVM cells may be connected to the latch nodes Q/QB 202, 204 of the SRAM cell. Each NVM cell includes a selective transistor to form the NVM cell with an NVM device.

Figure 2B:
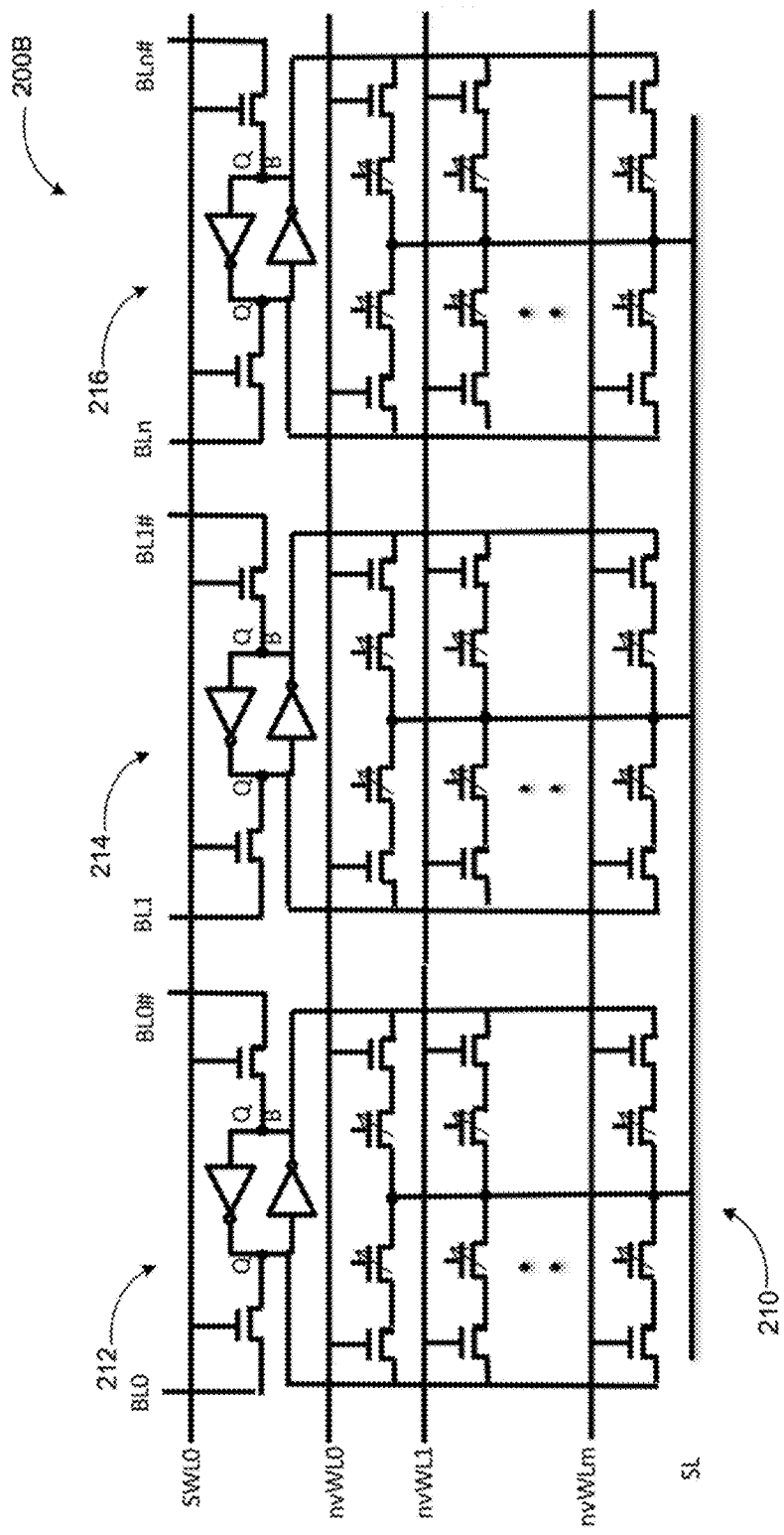
FIG. 2B is a schematics diagram of an array structure formed by the example NVSRAM cells of FIG. 2A.

FIG. 2B is a schematics diagram of an array structure formed by the example NVSRAM cells of FIG. 2A, arranged according to at least some embodiments presented herein.

Diagram 200B shows three example NVSRAM cells 212, 214, 216 combined to form a memory array. Any number of cells may be combined to form multi-cell arrays. The fast SRAM cells share the same word line SWL0, while NVM cells of a same row share respective word lines such as nvWL0, nvWL1, etc. All NVSRAM cells may be coupled to SL 210 as shown in the diagram.

Figure 3A:
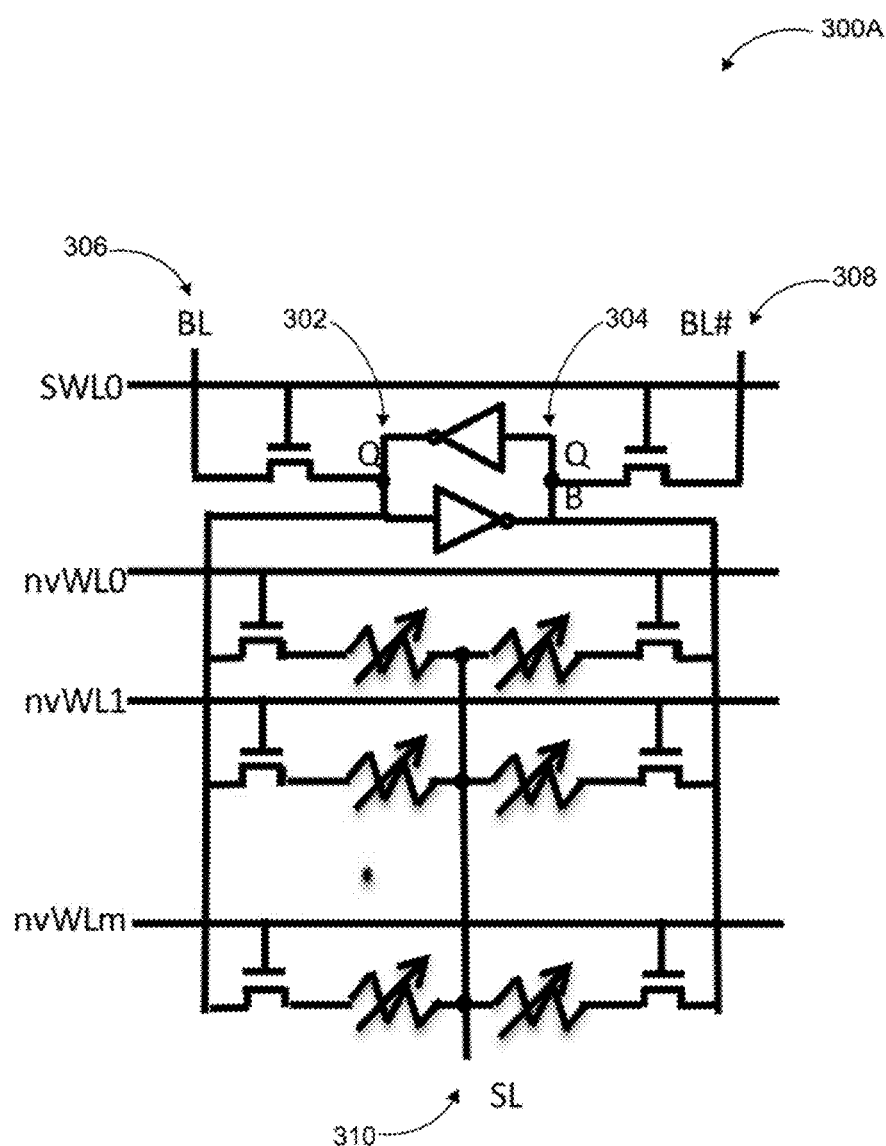
FIG. 3A is a schematic circuit diagram illustrating a further example NVSRAM cell formed by a combination of an SRAM cell with multiple resistive NVM cells.

FIG. 3A is a schematic circuit diagram illustrating a further example NVSRAM cell formed by a combination of an SRAM cell with multiple resistive NVM cells, arranged according to at least some embodiments presented herein.

Diagram 300A shows a cell structure for an NVSRAM cell with an SRAM cell (fast SRAM) characterized by the word line SWL0 and two bitlines BL 306, BL#308 coupled to multiple NVM cells 310 forming the rows. The NVM cells may be connected to the latch nodes Q/QB 302, 304 of the SRAM cell. Each NVM cell includes an adjustable resistor and a transistor to form the NVM cell (resistive NVM device).

Figure 3B:
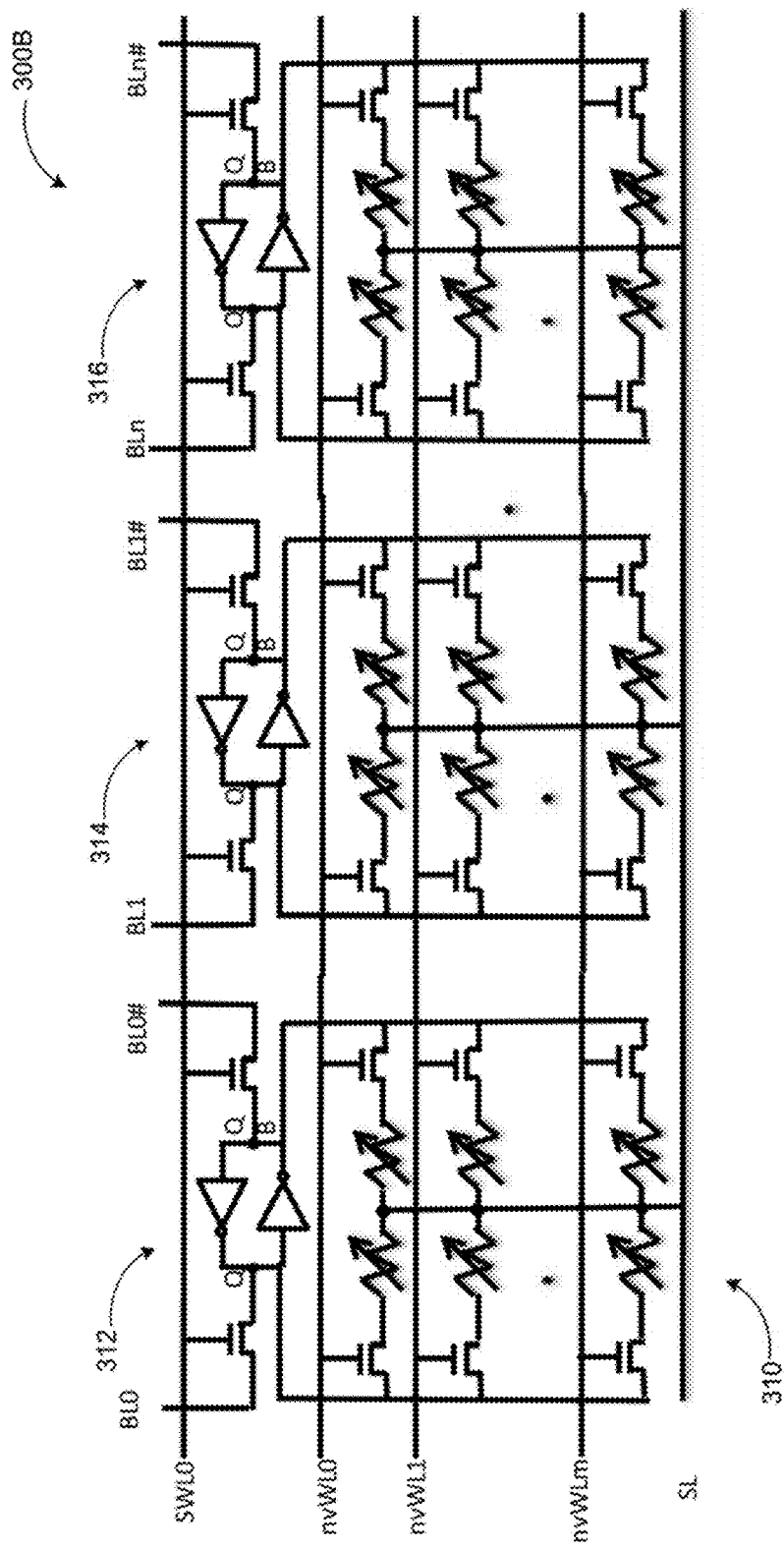
FIG. 3B is a schematics diagram of an array structure formed by the example NVSRAM cells of FIG. 3A.

FIG. 3B is a schematics diagram of an array structure formed by the example NVSRAM cells of FIG. 3A, arranged according to at least some embodiments presented herein.

Diagram 300B shows three example NVSRAM cells 312, 314, 316 combined to form a memory array. Any number of cells may be combined to form multi-cell arrays. The fast SRAM cells share the same word line SWL0, while NVM cells of a same row share respective word lines such as nvWL0, nvWL1, etc. All NVSRAM cells may be coupled to SL 310 as shown in the diagram.

Figure 4A:
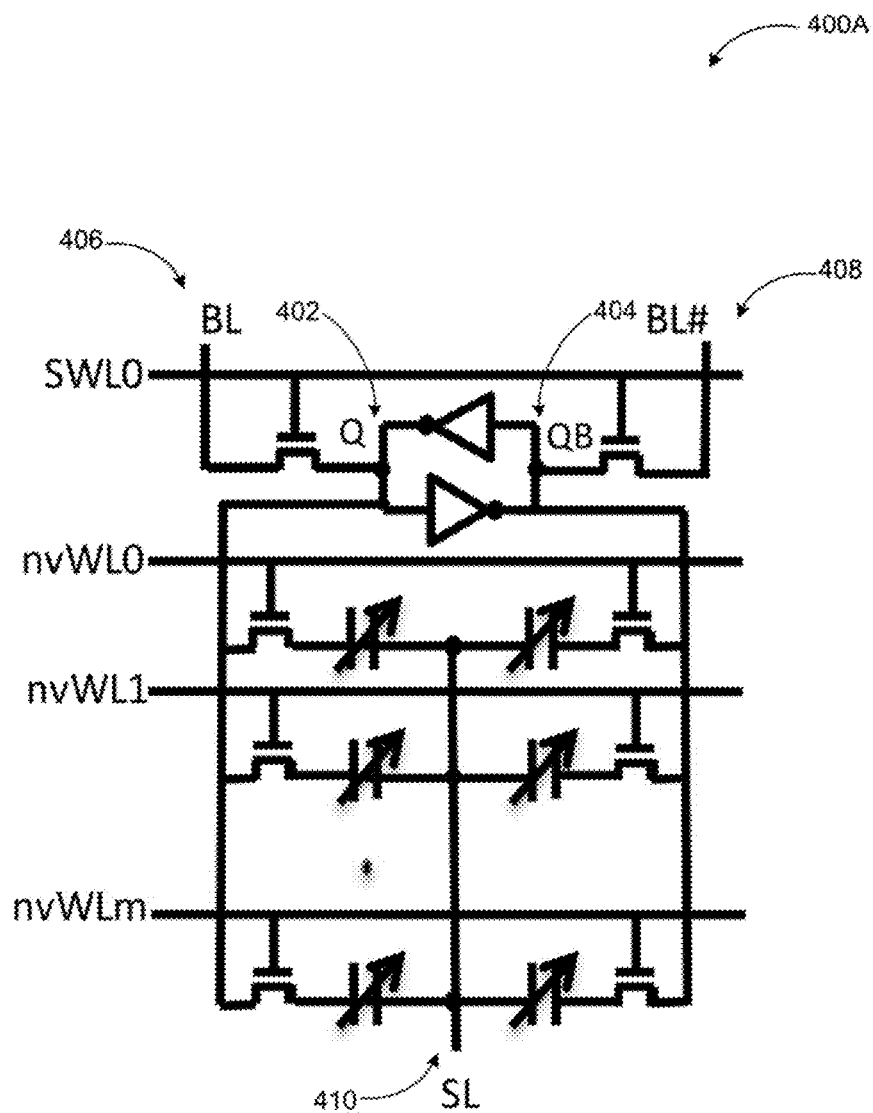
FIG. 4A is a schematic circuit diagram illustrating an example multi-bit SRAM cell formed by a combination of a fast SRAM cell with multiple capacitor based memory cells.

FIG. 4A is a schematic circuit diagram illustrating an example multi-bit SRAM cell formed by a combination of a fast SRAM cell with multiple capacitor based memory cells, arranged according to at least some embodiments presented herein.

Diagram 400A shows a cell structure for an NVSRAM cell with an SRAM cell (fast SRAM) characterized by the word line SWL0 and two bitlines BL 406, BL#408 coupled to multiple NVM cells 410 forming the rows. The NVM cells may be connected to the latch nodes Q/QB 402, 404 of the SRAM cell. Each NVM cell includes an adjustable capacitor and a transistor to form the NVM cell (capacitive NVM device).

Figure 4B:
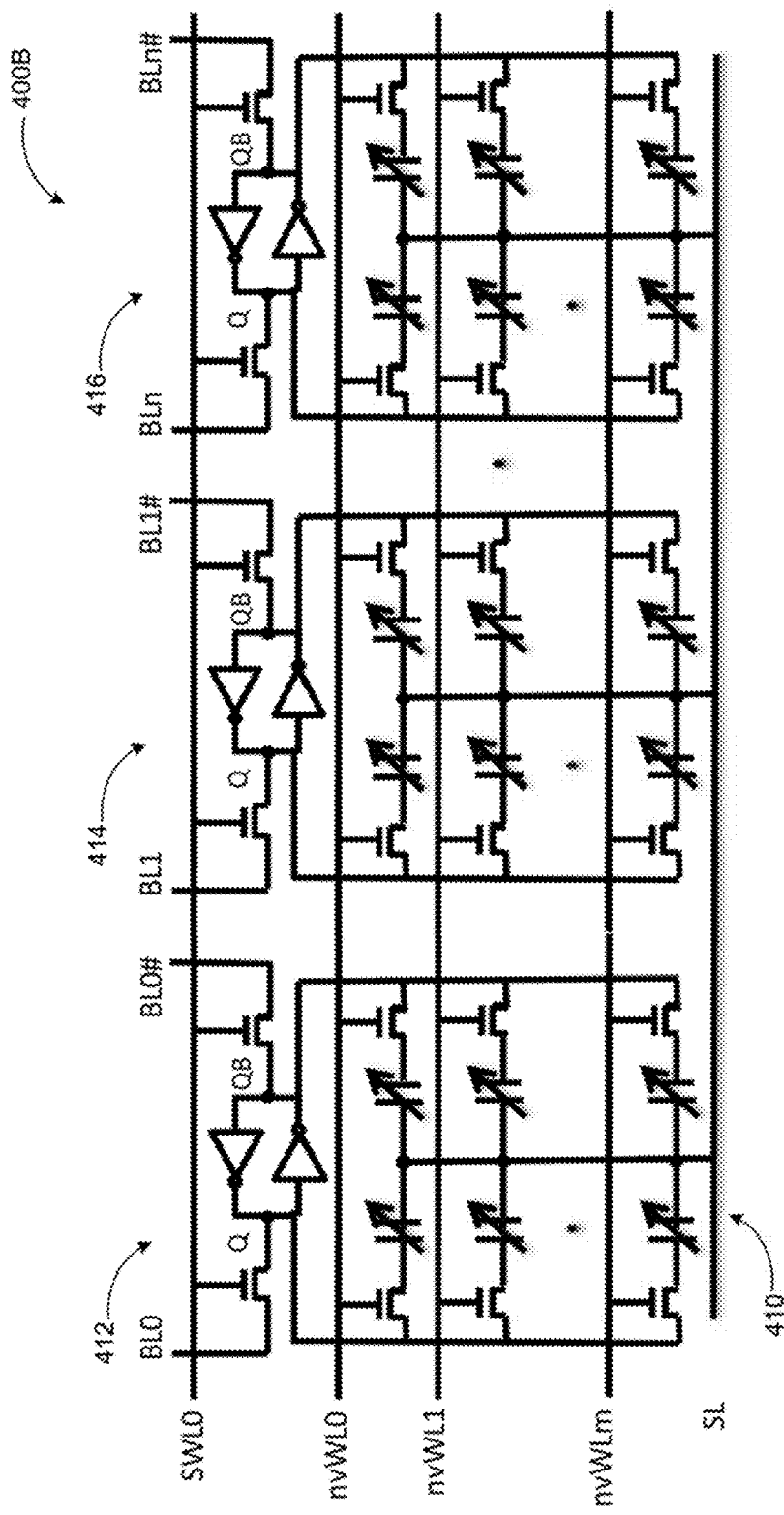
FIG. 4B is a schematics diagram of an array structure formed by the example multi-bit SRAM cells of FIG. 4A.

FIG. 4B is a schematics diagram of an array structure formed by the example multi-bit SRAM cells of FIG. 4A, arranged according to at least some embodiments presented herein.

Diagram 400B shows three example NVSRAM cells 412, 414, 416 combined to form a memory array. Any number of cells may be combined to form multi-cell arrays. The fast SRAM cells share the same word line SWL0, while NVM cells of a same row share respective word lines such as nvWL0, nvWL1, etc. All NVSRAM cells may be coupled to SL 410 as shown in the diagram.

Figure 5A:
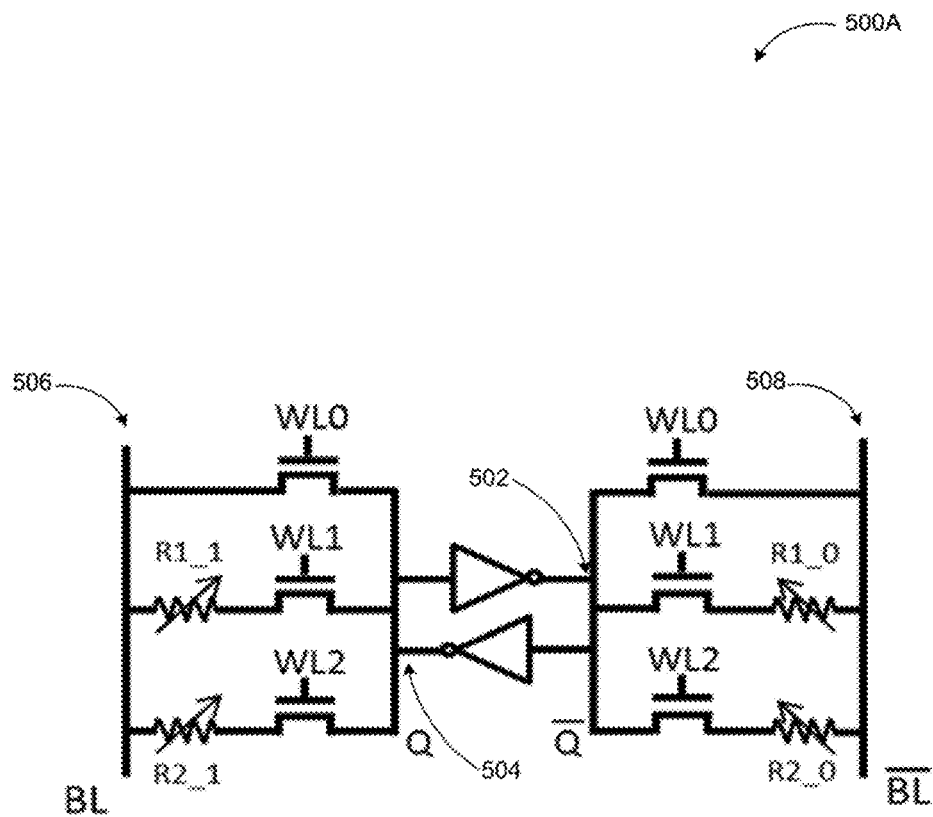
FIG. 5A is a schematic circuit diagram illustrating an example multi-bit NVSRAM cell formed by a combination of a fast SRAM cell with multiple resistive NVM cells.

FIG. 5A is a schematic circuit diagram illustrating an example multi-bit NVSRAM cell formed by a combination of a fast SRAM cell with multiple resistive NVM cells, arranged according to at least some embodiments presented herein.

Diagram 500A shows a cell structure for an NVSRAM cell, where multiple rows of resistive NVM devices 506, 508 are coupled through the latch nodes Q/Q' 504/502. The bitlines connect the NVM cell rows, whereas the word lines are coupled to the gates of the NVM cell transistors. Each NVM cell includes an adjustable resistor and a transistor to form the NVM cell (resistive NVM device).

Figure 5B:
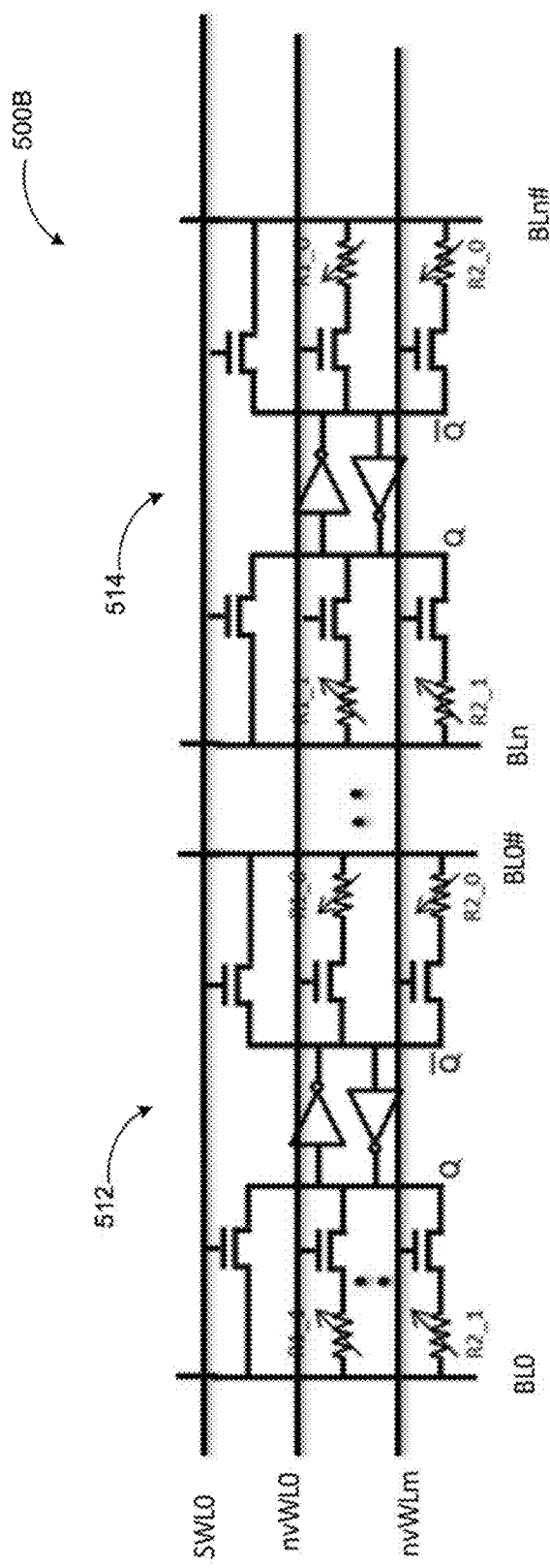
FIG. 5B is a schematics diagram of an array structure formed by the example multi-bit NVSRAM cells of FIG. 5A.

FIG. 5B is a schematics diagram of an array structure formed by the example multi-bit NVSRAM cells of FIG. 5A, arranged according to at least some embodiments presented herein.

Diagram 500B shows two example NVSRAM cells 512 and 514 combined to form a memory array. Any number of cells may be combined to form multi-cell arrays. Word line SWL0 couples to the gates of the transistors in the first row of devices, while NVM cells of a same row share respective word lines such as nvWL0, nvWL1, etc.

Figure 6:
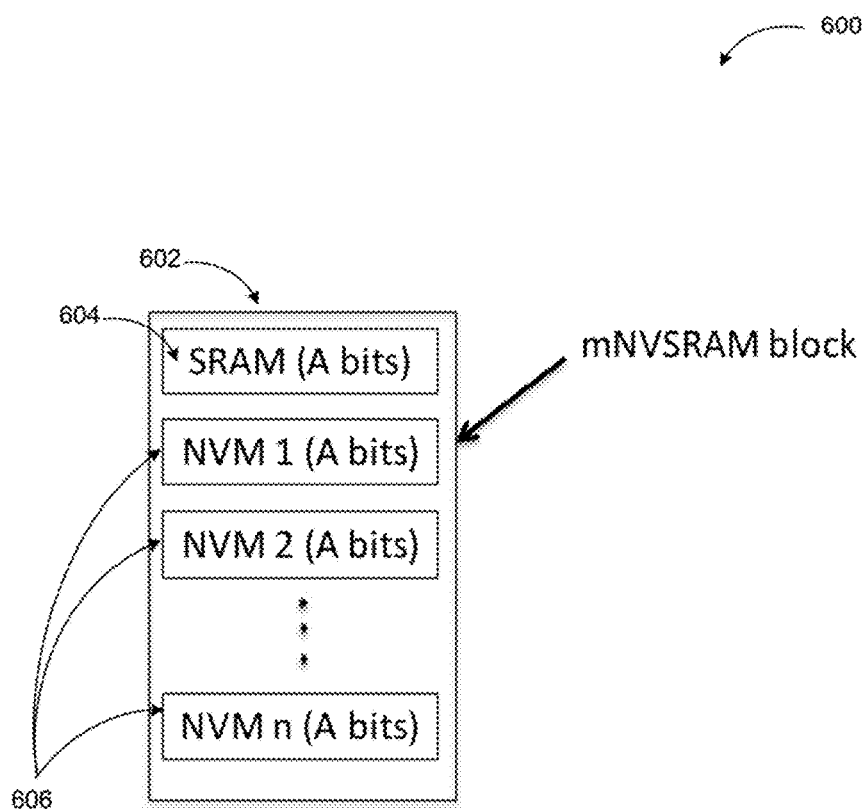
FIG. 6 illustrates an example mNVSRAM block.

FIG. 6 illustrates an example mNVSRAM block, arranged according to at least some embodiments presented herein.

Based on the cell structures described in FIG. 1A through 5A, but not limited to these cell structures, mNVSRAM (multi-bit NVSRAM or multi-page NVSRAM) block/array devices may be formed. Typically, the SRAM cell and NVM cells are integrated at bit level. The stored data of one bit SRAM cell may be stored (written) to any one bit of its associated n-bit NVRAM cells, and the data stored in any one bit of the n-bit NVSRAM cells may be read by and/or loaded into its associated one bit SRAM. The one bit SRAM cell may serve as the interface for its associated n-bit NVRAM cells when data is exchanged with other devices (outside the mNVSRAM block).

In the example block of diagram 600, the mNVSRAM block 602 may contain an A bit SRAM 604, and an A×n bit NVM memory 606. On some practical implementations, two NVRAM cells may be needed to form one bit NVM memory, but embodiments are not limited to this configuration. The bandwidth for this memory is A bit wide, which means A bit data stored on NVM may be transferred to/from SRAM in 1 or a few clock cycles.

Figure 7:
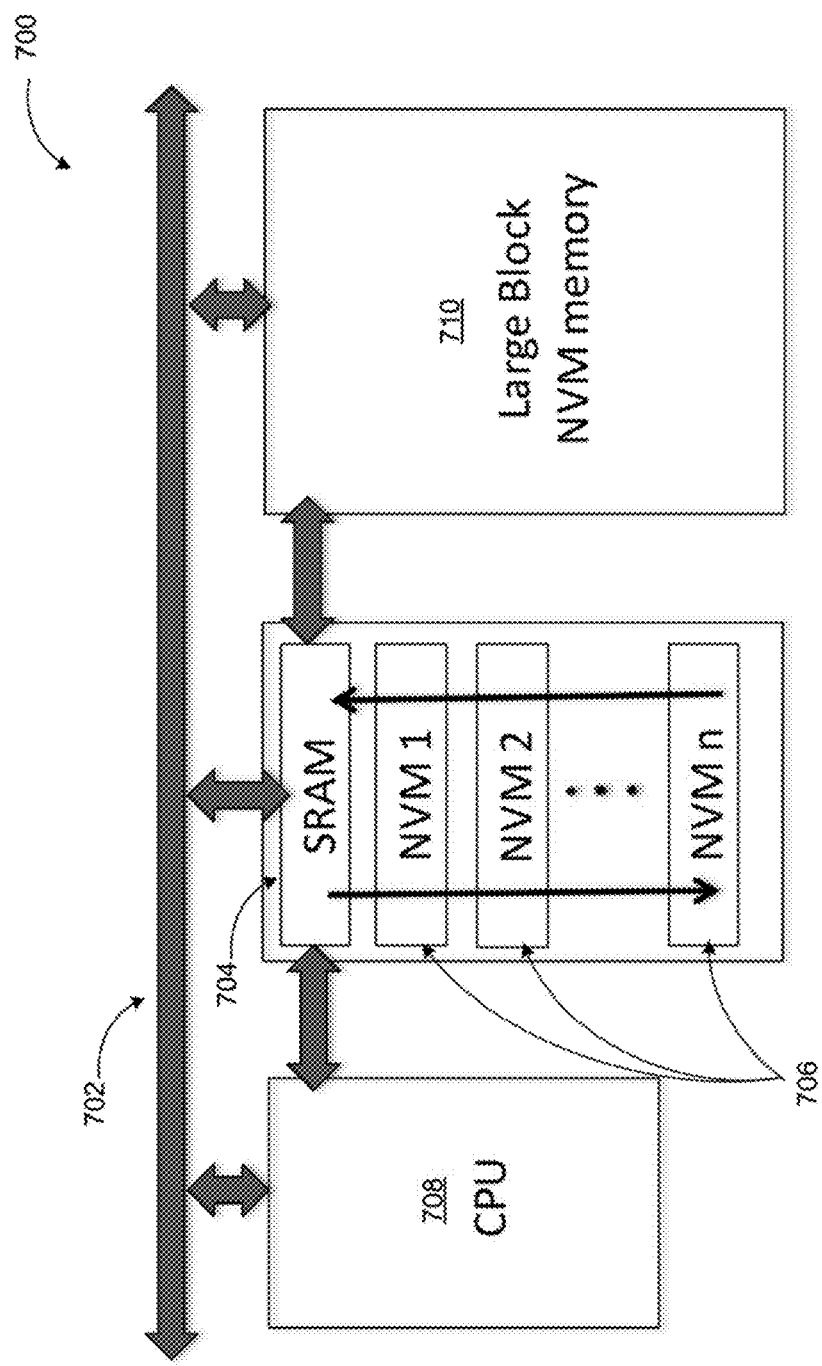
FIG. 7 illustrates an example memory architecture employing mNVSRAM.

FIG. 7 illustrates an example memory architecture employing mNVSRAM, arranged according to at least some embodiments presented herein.

In the example memory structure 702 of diagram 700 using mNVSRAM for a computing system, the mNVSRAM block may serve a few functions: (1) The fast SRAM 704 in the mNVSRAM block may serve as the buffer for large block NVM memory 710, which is typically relatively slow, and this arrangement may significantly increase the data exchange rate between CPU 708 (or other computing units/core) and the large NVM memory 710; (2) The mNVSRAM block may provide a fast boot function. Boot code for the system may be stored in the NVM parts in the mNVSRAM block, and due to the high bandwidth communication between SRAM 704 and its associated NVM memories (706), the boot code stored in the NVM 706 in mNVSRAM block may be transferred into SRAM 704 in 1 or a few clock cycles enabling fast boot up function; (3) Deep sleep and fast wake up function. During deep sleep mode, all memory parts may be turned off. When the system wakes up, the code stored in the NVM 706 in mNVSRAM block may be transferred into SRAM 704 in 1 or a few clock cycles enabling fast wake up voiding a need to wake up any other memory part, which may also result in energy savings for the computing system; (4) The mNVSRAM block may be also used as a local memory to store the frequently used code. Then, the total system power may be reduced because the local memory does not need to charge a large array loading to fetch the data. In some cases, the SRAM 704 of the mNVSRAM block may be shared as one part of the system SRAM. The SRAM 704 in mNVSRAM block may also be connected directly to CPU 708 and/or the large block NVM memory 710 to be used directly by CPU 708.

Figure 8:
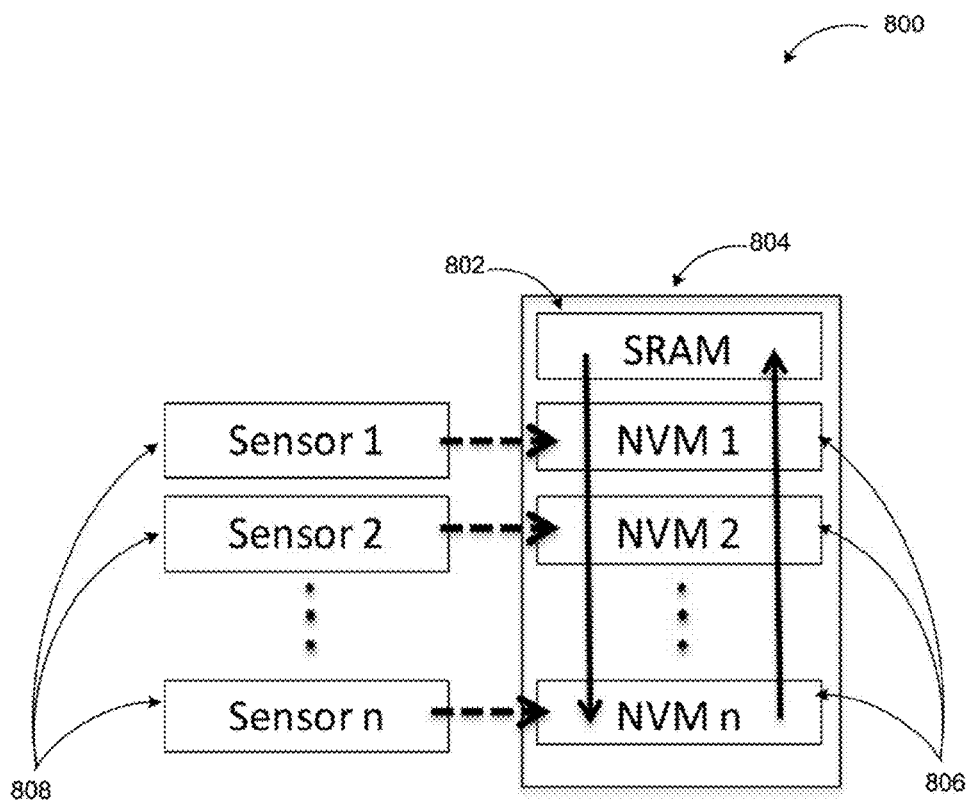
FIG. 8 illustrates the use of an mNVSRAM block in a sensor hub application.

FIG. 8 illustrates the use of an mNVSRAM block in a sensor hub application, arranged according to at least some embodiments presented herein.

Diagram 800 shows an example memory structure using an mNVSRAM block 804 for a sensor hub application. The driver and library for each sensor 808 may be stored into the NVM part 806 of the mNVSRAM block 804, so they can be quickly loaded into SRAM 802 of the mNVSRAM block 804 to be executed quickly without using main memory to save energy and provide quick action. Each page of the mNVSRAM block 804 may store the driver and library for one sensor or multiple sensors. In some examples, the boot code may be stored into the mNVSRAM block 804 to achieve a fast boot up/wake up speed. The SRAM 802 of the mNVSRAM block 804 may be shut off in the sleep mode to reduce the standby power. In other cases, the large NVM memory block may be turned off to save power.

Figure 9:
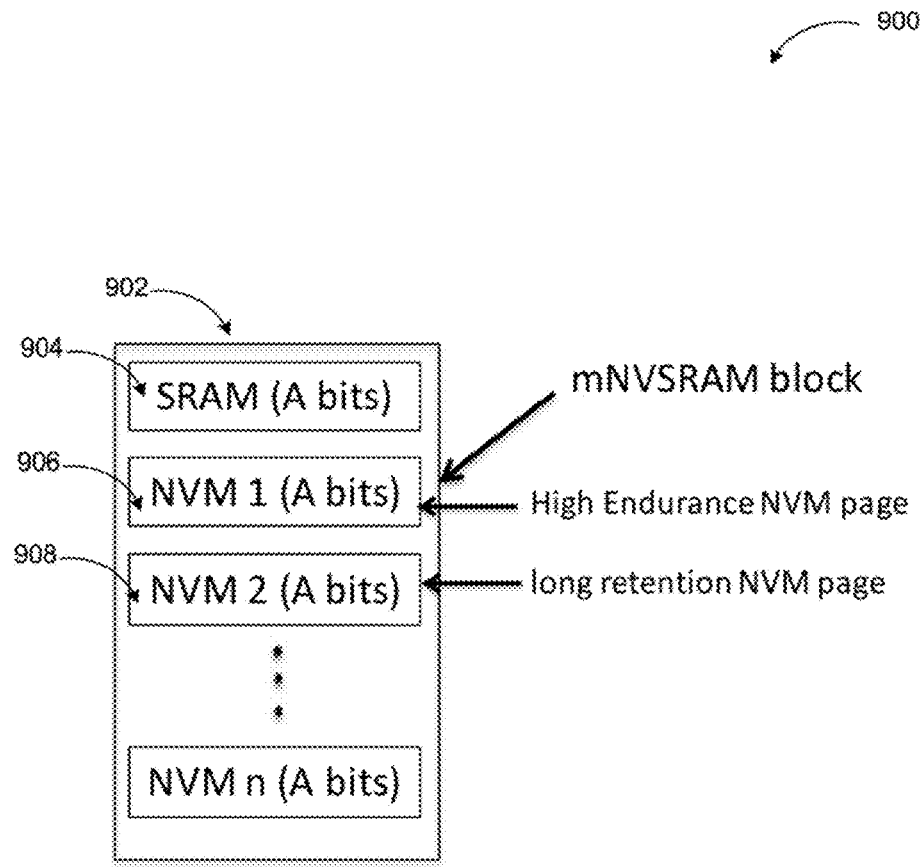
FIG. 9 illustrates a multi-mode mNVSRAM block with a different NVRAM configuration.

FIG. 9 illustrates a multi-mode mNVSRAM block with a different NVRAM configuration, arranged according to at least some embodiments presented herein.

As shown in diagram 900, each of the n NVM blocks/pages of the mNVSRAM (multi-bit NVSRAM or multi-page NVSRAM) block/array 902 may be configured or programmed or fabricated into different modes to serve different purposes. For example, NVM page/block 906 may be configured to high endurance mode to store data which needs to be written/erased frequently, while NVM page/block 908 may be configured to long retention mode used to store code which needs long retention time.

For example, in Ferroelectric RAM (FRAM), especially $HfO_2$ based FRAM, the endurance and retention time can be modulated by program pulse (some RRAMs may also have this effect). So, by adjusting the program pulse, some NVM pages/blocks in the mNVSRAM may be configured to high endurance mode, and other NVM pages/blocks may be configured to long retention mode. Normally, there exists a trade-off between the endurance and retention. However, using the structure and schemes according to embodiments, a more balanced hybrid memory may be achieved.

Various types of transistors may be used in embodiments. The disclosure may use, for purposes of illustration, metal-oxide semiconductor field effect transistors (MOSFET). A MOSFET may have a source terminal (e.g., a first terminal), a drain terminal (e.g., a second terminal), and a control terminal. When an appropriate level of bias signal is applied to the control terminal, the transistor may be activated (e.g., biased into active operation) wherein conduction between the source terminal and the drain terminal may be facilitated. Depending on the type of transistor (e.g., N-type or P-type), an appropriate level of bias signal may be applied, or previously applied bias signal may be removed, to cause the transistor to be deactivated wherein conduction between the source and the drain may be abated. A MOSFET "terminal" may also be termed a "port."

An NVM cell in the multi-bit or multi-page NVSRAM according to embodiments is not limited to floating gate memories, but may also be a SONOS cell, a RRAM (resistive RAM), phase change memories, or magnetic base memories, such as MRAM, and STTRAM, or a Ferroelectric based RAM, a Ferroelectric capacitor based memory, or comparable NVM cells.

Some embodiments are directed to example processes to operate low power memory systems. The operations of any process described herein are not necessarily presented in any particular order and that performance of some or all of the operations in an alternative order(s) is possible and is contemplated. The operations have been presented in the demonstrated order for ease of description and illustration. Operations may be added, combined, modified, omitted, and/or performed simultaneously, in a different order, etc., without departing from the scope of the present disclosure.

The illustrated process can be ended at any time and need not be performed in its entirety. Some or all operations of the processes, and/or substantially equivalent operations, can be performed by execution by one or more processors of computer-readable instructions included on a computer storage media, such as described herein, including a tangible non-transitory computer-readable storage medium. The term "computer-readable instructions," and variants thereof, as used in the description and claims, is used expansively herein to include routines, applications, application modules, program modules, programs, components, data structures, algorithms, or the like. Computer-readable instructions can be implemented on various system configurations, including single-processor or multiprocessor systems, mini-computers, mainframe computers, personal computers, hand-held computing devices, microprocessor-based, programmable consumer electronics, combinations thereof, or the like.

Figure 10:
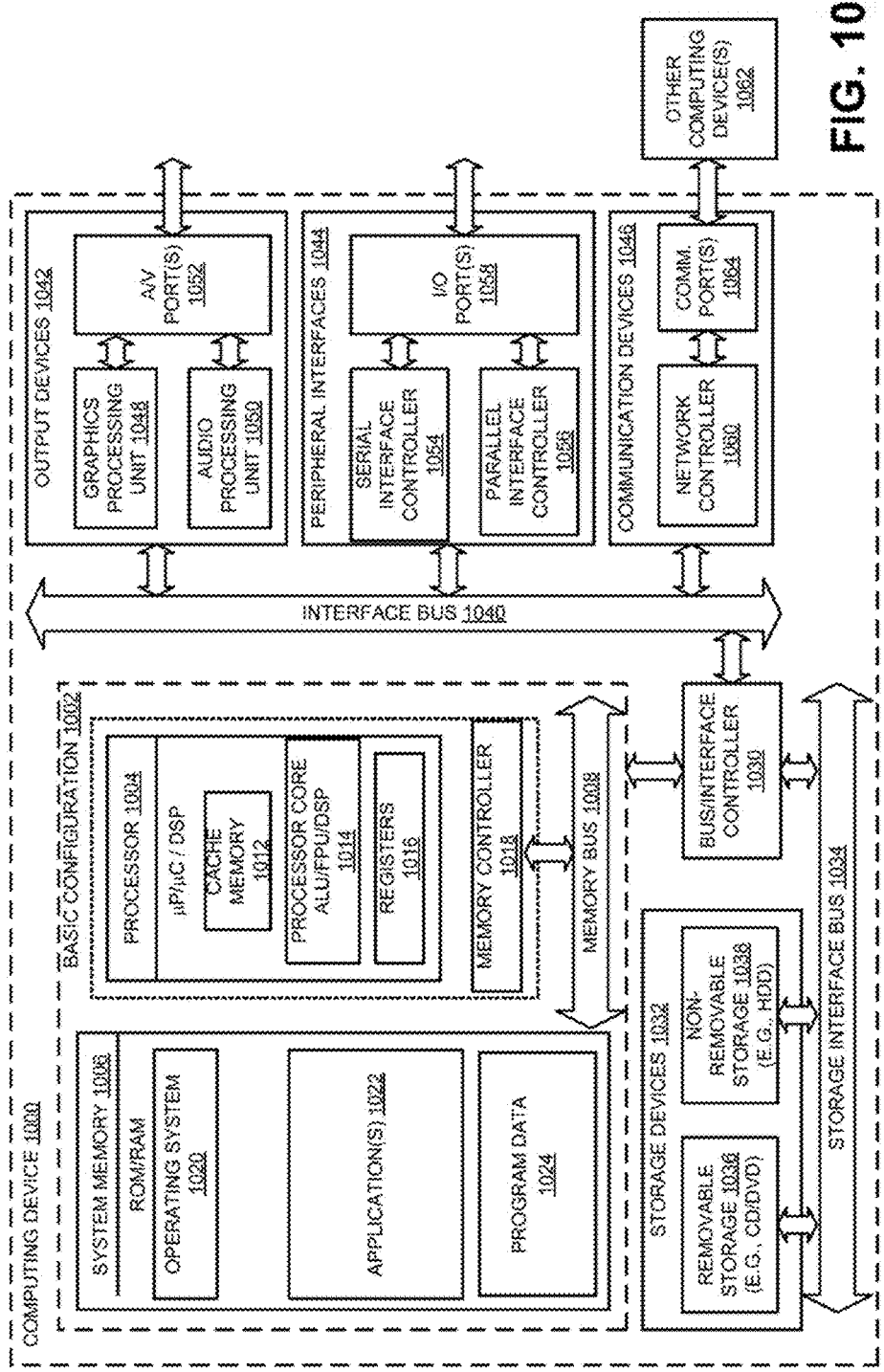
FIG. 10 is a block diagram illustrating an example computing device that is arranged for implementing example mNVSRAM structures as discussed herein.

FIG. 10 is a block diagram illustrating an example computing device 1000 that is arranged for implementing and/or operating low power memory systems as discussed herein, in accordance with at least some embodiments described herein. In a very basic configuration 1002, computing device 1000 typically includes one or more processors 1004 and system memory 1006. A memory bus 1008 can be used for communicating between the processor 1004 and the system memory 1006.

Depending on the desired configuration, processor 1004 can be of any type including but not limited to a microprocessor (µP), a microcontroller (µC), a digital signal processor (DSP), or any combination thereof. Processor 1004 can include one more levels of caching, such as cache memory 1012, a processor core 1014, and registers 1016. The processor core 1014 can include an arithmetic logic unit (ALU), a floating point unit (FPU), a digital signal processing core (DSP core), or any combination thereof. A memory controller 1018 can also be used with the processor 1004, or in some implementations the memory controller 1010 can be an internal part of the processor 1004.

Depending on the desired configuration, the system memory 1006 can be of any type including but not limited to volatile memory (such as RAM), non-volatile memory (such as ROM, flash memory, etc.) or any combination thereof. System memory 1006 typically includes an operating system 1020, one or more applications 1022, and program data 1024.

Computing device 1000 can have additional features or functionality, and additional interfaces to facilitate communications between the basic configuration 1002 and any required devices and interfaces. For example, a bus/interface controller 1040 can be used to facilitate communications between the basic configuration 1002 and one or more data storage devices 1032 via a storage interface bus 1034. The data storage devices 1032 can be removable storage devices 1036, non-removable storage devices 1038, or a combination thereof. Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media can include volatile and nonvolatile, removable and non-removable media implemented in any method or technology for storage of information, such as computer readable instructions, data structures, program modules, or other data.

System memory 1006, removable storage 1036 and non-removable storage 1038 are all examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which can be used to store the desired information and which can be accessed by computing device 1000. Any such computer storage media can be part of device 1000. Thus, any of the computer storage media may be implemented using the SRAM based memory structures as discussed herein.

Computing device 1000 can also include an interface bus 1040 for facilitating communication from various interface devices (e.g., output interfaces, peripheral interfaces, and communication interfaces) to the basic configuration 1002 via the bus/interface controller 1030. Example output devices 1042 include a graphics processing unit 1048 and an audio processing unit 1050, which can be configured to communicate to various external devices such as a display or speakers via one or more A/V ports 1052. Example peripheral interfaces 1044 include a serial interface controller 1054 or a parallel interface controller 1056, which can be configured to communicate with external devices such as input devices (e.g., keyboard, mouse, pen, voice input device, touch input device, etc.) or other peripheral devices (e.g., printer, scanner, etc.) via one or more I/O ports 1058. An example communication device 1046 includes a network controller 1060, which can be arranged to facilitate communications with one or more other computing devices 1062 over a network communication via one or more communication ports 1064. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, communication media can include wired media such as a wired network or direct-wired connection, and wireless media such as acoustic, radio frequency (RF), infrared (IR) and other wireless media. The term computer readable media as used herein can include both storage media and communication media.

Computing device 1000 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 1000 can also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, compounds, or compositions, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations.

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include, but not be limited to, systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

Further, the use of the terms "first," "second," "third," "fourth," and the like is to distinguish between repeated instances of a component or a step in a process and does not impose a serial or temporal limitations unless specifically stated to require such serial or temporal order.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," or the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A multi-bit non-volatile static random access memory (mNVSRAM) device, comprising:
    a static random access memory (SRAM) cell coupled to a pair of bitlines;
    a plurality of non-volatile memory (NVM) cells directly coupled to the SRAM cell through a pair of inside latch nodes of the SRAM cell, wherein
        the NVM cells include a SONOS transistor cell, a floating gate cell, a 1T/1R resistive RAM, a resistive memory based cell, a phase change memory based cell, a ferroelectric RAM based cell, a ferroelectric capacitor based cell, or a magnetic RAM based cell,
        the NVM cells are connected to the bitlines through a pair of passing transistors of the SRAM cell,
        each of the NVM cells is connected to a corresponding word line, and
        each of the NVM cells is enabled to exchange data with the SRAM cell by selection of the corresponding word line.

2. The mNVSRAM device of claim 1, wherein each of the plurality of NVM cells comprises a pair of transistors with adjustable threshold voltage.

3. The mNVSRAM device of claim 1, wherein each of the plurality of NVM cells comprises a pair of transistors with adjustable threshold voltage and a pair of selective transistors.

4. The mNVSRAM device of claim 1, wherein each of the plurality of NVM cells comprises a pair of adjustable capacitor devices and a pair of selective transistors.

5. The mNVSRAM device of claim 1, wherein each of the plurality of NVM cells comprises a pair of adjustable resistor devices and a pair of selective transistors, and wherein the NVM cells are coupled to the same bitlines as the SRAM cell.

6. The mNVSRAM device of claim 1, wherein the plurality of NVM cells include an eFlash cell or a pFlash cell, and the plurality of NVM cells includes at least three NVM cells.

7. A multi-bit non-volatile static random access memory (mNVSRAM) device, comprising:
    a plurality of static random access memory (SRAM) cells coupled to a pair of bitlines;
    a plurality of non-volatile memory (NVM) arrays, each NVM array having a plurality of NVM cells associated with a corresponding SRAM cell and each of the plurality of NVM cells directly coupled to the corresponding SRAM cell through a pair of inside latch nodes of the corresponding SRAM cell, wherein the plurality of NVM cells include a SONOS transistor cell, a floating gate cell, a 1T/1R resistive RAM, a resistive memory based cell, a phase change memory based cell, a ferroelectric RAM based cell, a ferroelectric capacitor based cell, or a magnetic RAM based cell, the NVM cells of each NVM array are connected to a pair of bitlines through a pair of passing transistors of the corresponding SRAM cell, each of the NVM cells of the plurality of NVM arrays is connected to a corresponding word line, and each of the NVM cells is enabled to exchange data with the corresponding SRAM cell by selection of the corresponding word line.

8. The mNVSRAM device of claim 7, wherein at least a portion of the plurality of SRAM cells is configured as a buffer for a large block NVM memory of a computing system to increase a data exchange rate between a computing unit and the large block NVM memory.

9. The mNVSRAM device of claim 7, wherein at least a portion of the plurality of NVM arrays is configured to store a boot code for a computing system and to transfer the boot code to a corresponding portion of the plurality of SRAM cells during a power-up of the computing system.

10. The mNVSRAM device of claim 7, wherein at least a portion of the plurality of NVM arrays is configured to store a wake-up code for a computing system and to transfer the wake-up code to a corresponding portion of the plurality of SRAM cells during a wake-up from a deep sleep mode of the computing system.

11. The mNVSRAM device of claim 7, wherein at least a portion of the plurality of NVM arrays is configured as a local memory to store executable code that is used by a computing system.

12. The mNVSRAM device of claim 7, wherein at least a portion of the plurality of SRAM cells is configured as part of a shared system SRAM of a computing system.

13. The mNVSRAM device of claim 7, wherein at least a portion of the plurality of SRAM cells is coupled directly to a processor or a large block NVM memory of a computing system to be used directly by the processor.

14. The mNVSRAM device of claim 7, wherein at least a portion of the plurality of NVM arrays is configured to store a driver and a library for a sensor in a sensor hub application and to transfer the driver and the library to a corresponding portion of the plurality of SRAM cells for execution.

15. The mNVSRAM device of claim 7, wherein a portion of each of the plurality of NVM arrays is configured as high endurance storage to store data for a short retention period and another portion of each of the plurality of NVM arrays is configured as long retention storage to store data that needs to be stored for a long retention period.

16. The mNVSRAM device of claim 7, wherein a portion of the plurality of NVM arrays is configurable as a high endurance storage or a long retention storage through change of a program pulse based on a need of a computing system that includes the memory device.

* * * * *